United States Patent
Feng et al.

(10) Patent No.: US 11,189,679 B2
(45) Date of Patent: Nov. 30, 2021

(54) ARRAY SUBSTRATE AND MANUFACTURING METHOD THEREFOR, AND DISPLAY DEVICE

(71) Applicant: BOE TECHNOLOGY GROUP CO., LTD., Beijing (CN)

(72) Inventors: Jing Feng, Beijing (CN); Dongsheng Yin, Beijing (CN); Ce Ning, Beijing (CN); Jiushi Wang, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 16/711,972

(22) Filed: Dec. 12, 2019

(65) Prior Publication Data

US 2020/0119120 A1 Apr. 16, 2020

Related U.S. Application Data

(63) Continuation-in-part of application No. PCT/CN2019/080383, filed on Mar. 29, 2019.

(30) Foreign Application Priority Data

Mar. 29, 2018 (CN) .......................... 201810270135.8

(51) Int. Cl.
*H01L 29/08* (2006.01)
*H01L 27/32* (2006.01)

(52) U.S. Cl.
CPC ...... *H01L 27/3262* (2013.01); *H01L 27/3265* (2013.01); *H01L 27/3272* (2013.01)

(58) Field of Classification Search
CPC ............. H01L 27/3262; H01L 27/3265; H01L 27/3272; H01L 27/1255; H01L 27/1248
See application file for complete search history.

(56) References Cited

U.S. PATENT DOCUMENTS

2007/0278480 A1* 12/2007 Hwang ............... H01L 27/1255
257/40
2008/0237585 A1 10/2008 Kim
(Continued)

FOREIGN PATENT DOCUMENTS

CN 103904086 A 7/2014
CN 107403804 A 11/2017
(Continued)

OTHER PUBLICATIONS

International Search Report and Written Opinion issued in corresponding International Application No. PCT/CN2019/080383, dated Jun. 12, 2019, with English language translation.
(Continued)

*Primary Examiner* — Phuc T Dang
(74) *Attorney, Agent, or Firm* — McDermott Will and Emery LLP

(57) ABSTRACT

An array substrate includes a base substrate and a plurality of pixel units disposed on a base substrate, and at least one pixel unit includes a plurality of thin film transistors, a first electrode, and a second electrode. The plurality of thin film transistors include at least one first thin film transistor including a first active pattern, a first gate, a first source and a first drain. The first electrode is disposed in a same layer as the first active pattern, the first electrode is coupled to the first drain, and the second electrode is disposed in a same layer as the first gate. Orthographic projections of any two in a group consisting of the first electrode, the second electrode, and the first drain on the base substrate have an overlapping region.

15 Claims, 8 Drawing Sheets

(56) References Cited

U.S. PATENT DOCUMENTS

| | | | | |
|---|---|---|---|---|
| 2014/0054562 A1* | 2/2014 | Lee | .................... | H01L 27/3276 |
| | | | | 257/40 |
| 2014/0175445 A1 | 6/2014 | Cai et al. | | |
| 2015/0097172 A1* | 4/2015 | Han | ................. | G02F 1/136213 |
| | | | | 257/40 |
| 2017/0040394 A1* | 2/2017 | Huang | ............... | H01L 27/3248 |
| 2018/0012948 A1* | 1/2018 | Lee | .................... | H01L 27/1225 |
| 2019/0305064 A1* | 10/2019 | Kuniyoshi | ......... | H01L 27/3265 |
| 2020/0119120 A1 | 4/2020 | Feng et al. | | |

FOREIGN PATENT DOCUMENTS

| | | |
|---|---|---|
| CN | 107452808 A | 12/2017 |
| CN | 108461529 A | 8/2018 |

OTHER PUBLICATIONS

First Office Action issued in corresponding Chinese Application No. 201810270135.8, dated Apr. 22, 2020, with English language translation.

* cited by examiner

;# ARRAY SUBSTRATE AND MANUFACTURING METHOD THEREFOR, AND DISPLAY DEVICE

CROSS-REFERENCE TO RELATED APPLICATIONS

This application is a Continuation in part of Application of PCT/CN2019/080383 filed on Mar. 29, 2019, which claims priority to Chinese Patent Application No. 201810270135.8 filed on Mar. 29, 2018, which are incorporated herein by reference in their entirety.

TECHNICAL FIELD

The present disclosure relates to the field of display technologies, and in particular, to an array substrate and a method of manufacturing the same, and a display device.

BACKGROUND

A pixel unit (Pixel) is a display unit including a storage capacitor and thin film transistors, and is the most basic display unit in a display device. The smaller a size of the pixel unit is, the more pixel units in the display device will be, the higher a display resolution of the display device will be, the finer an image displayed by the display device will be, and the more information conveyed by the image will be.

SUMMARY

In a first aspect, an array substrate is provided. The array substrate includes a base substrate and a plurality of pixel units disposed on a base substrate. At least one pixel unit includes: a plurality of thin film transistors, a first electrode, and a second electrode. The plurality of thin film transistors include at least one first thin film transistor. The at least one first thin film transistor includes a first active pattern, a first gate, a first source and a first drain, the first active pattern disposed above the base substrate, the first gate disposed at a side of the first active pattern away from the base substrate, the first source and the first drain that are disposed at a side of the first gate away from the base substrate, and the first source and the first drain coupled to the first active pattern. The first electrode is disposed in a same layer as the first active pattern, and the first electrode is coupled to the first drain. The second electrode is disposed in a same layer as the first gate. Orthographic projections of any two in a group consisting of the first electrode, the second electrode, and the first drain on the base substrate have an overlapping region.

In some embodiments of the present disclosure, the at least one pixel unit further includes a third electrode disposed between the first electrode and the base substrate. Orthographic projections of any two in a group consisting of the third electrode, the first electrode, the second electrode, and the first drain on the base substrate have an overlapping region, and the third electrode is coupled to the second electrode.

In some embodiments of the present disclosure, the plurality of thin film transistors further include a second thin film transistor. The second thin film transistor includes a second active pattern, a second gate, a second source and a second drain. The second active pattern is disposed in a same layer as the first active pattern. The second source and a second drain are disposed in a same layer as the first source and the first drain, the second source and the second drain are coupled to the second active pattern. The second drain is coupled to the second electrode, and the second drain is coupled to the third electrode. The second gate disposed in a same layer as the first gate.

In some embodiments of the present disclosure, the at least one pixel unit further includes light-shielding patterns disposed in a same layer as the third electrode, and orthographic projections of the first active pattern and the second active pattern on the base substrate are located within an orthographic projection of the light-shielding patterns on the base substrate.

In some embodiments of the present disclosure, a material of the first active pattern is an oxide semiconductor, and a material of the first electrode is an oxide conductor. And/or, the first gate is made of a same material as the second electrode. And/or, the light-shielding patterns are made of a same material as the third electrode, and a material of the light-shielding patterns is meta.

In some embodiments of the present disclosure, the third electrode and the light-shielding patterns are disposed on the base substrate, and the array substrate further comprises a buffer layer, a gate insulating layer, an interlayer insulating layer. The buffer layer is disposed between a layer where the third electrode and the light-shielding patterns are located, and a layer where the first active pattern, the second active pattern and the first electrode are located. The gate insulating layer is disposed between the layer where the first active pattern, the second active pattern and the first electrode are located, and a layer where the first gate, the second gate and the second electrode are located. An interlayer insulating layer is disposed between the layer where the first gate, the second gate and the second electrode are located, and a layer where the first source, the first drain, the second source and the second drain are located. The at least one pixel unit further includes: a first via hole, extending through the interlayer insulating layer, the second drain is coupled to the second electrode though the first via hole; a second via hole, extending through the interlayer insulating layer, the gate insulating layer, and the buffer layer, the second drain is coupled to the third electrode through the second via hole; and a third via hole, extending through the interlayer insulating layer and the gate insulating layer, the first drain is coupled to the first electrode through the third via hole.

In some embodiments of the present disclosure, the plurality of thin film transistors further includes a third thin film transistor. The third thin film transistor includes: a third active pattern, disposed in a same layer as the first active pattern; a third source and a third drain, that are disposed in a same layer as the first source and the first drain, the third source and the third drain are coupled to the third active pattern; and a third gate, disposed in a same layer as the first gate, the third gate is coupled to the second electrode.

In some embodiments of the present disclosure, the at least one pixel unit further includes a pixel electrode disposed at a side of the third source and the third drain away from the base substrate, and the first drain and the third drain are coupled to the pixel electrode.

In some embodiments of the present disclosure, the array substrate comprises a planarization layer disposed between a layer where the pixel electrode is located and a layer where the third source and the third drain are located the at least one pixel unit further includes: a fourth via hole, extending through the planarization layer, the third drain is coupled to the pixel electrode through the fourth via hole; and a fifth via hole, extending through the planarization layer, the first drain is coupled to the pixel electrode through the fifth via hole.

In some embodiments of the present disclosure, at least one pixel unit further includes: a light-emitting functional layer, disposed above a surface of the pixel electrode away from the base substrate, and a fourth electrode, disposed above a surface of the light-emitting functional layer away from the base substrate.

In some embodiments of the present disclosure, the second via hole includes: a first sub via hole, extending through the interlayer insulating layer; and a second sub via hole, extending through the gate insulating layer and the buffer layer. The at least one pixel unit further includes a first interconnecting pattern disposed in a same layer as the second electrode, the second drain is coupled to the first interconnecting patter through the first sub via hole, and the first interconnecting pattern is coupled to the third electrode though the second sub via hole.

In some embodiments of the present disclosure, the array substrate further comprises sense lines disposed in a same layer as the second electrode. The at least one pixel unit further includes a sixth via hole, a sixth via hole, a second interconnecting pattern, and a second interconnecting pattern. The sixth via hole includes a third sub via hole and a fourth sub via hole, the third sub via hole extends through the interlayer insulating layer, and the fourth sub via hole extends through the gate insulating layer and the buffer layer. The seventh via hole includes a fifth sub via hole and a sixth sub via hole, the fifth sub via hole extends through the interlayer insulating layer, and the sixth sub via hole extends through the gate insulating layer and the buffer layer. The second interconnecting pattern is disposed in a same layer as the second electrode, the second interconnecting patter is coupled to the first source through the third sub via hole, and the second interconnecting pattern is coupled to one of the light-shielding patterns through the fourth sub via hole, orthographic projections of the second interconnecting patter and the one of the light-shielding patterns on the base substrate have an overlapping region. The third interconnecting pattern is disposed in a same layer as the second electrode, the third interconnecting patter is coupled to one of the sense lines through the fifth sub via hole, and the third interconnecting patter is coupled to the one of the light-shielding patterns through the sixth sub via hole.

In a second aspect, a method of manufacturing an array substrate is provided.

The method comprise: forming first electrodes and active patterns in a same layer above the base substrate; forming second electrodes and gates in a same layer above the first electrodes and the active patterns, the gates being in one-to-one correspondence with the active patterns; and forming sources and drains above the second electrodes and the gates, each source and a corresponding drain being coupled to a corresponding active patter, orthographic projections of any two in a group consisting of each first electrode, a corresponding second electrode, and each drain of at least one drain on the base substrate have an overlapping region, and the first electrode is coupled to the at least one drain.

In some embodiments of the present disclosure, before forming the first electrodes and the active patterns in the same layer above the base substrate, the method further comprises: forming third electrodes on the base substrate, orthographic projections of any two in a group consisting of the first electrode, the corresponding second electrode, a corresponding third electrode, and each drain of the at least one drain on the base substrate have an overlapping region, and the corresponding third electrode is coupled to the corresponding second electrode.

In some embodiments of the present disclosure, forming the first electrodes and the active patterns in the same layer above the base substrate, includes: forming the first electrodes and first active patterns in a same layer forming the second electrodes and the gates in the same layer above the first electrode and the active patterns, includes: forming the second electrodes and first gates in a same layer, forming the sources and the drains above the second electrodes and the gates, includes: forming first sources and first drains, each first source and a corresponding first drain being coupled to a corresponding first active patter, the corresponding first drain being coupled to a corresponding first electrode. Orthographic projections of any two in a group consisting of the corresponding first electrode, a corresponding second electrode, and the corresponding first drain on the base substrate have an overlapping region.

In some embodiments of the present disclosure, forming the first electrodes and the active patterns in the same layer above the base substrate, further includes: forming second active patterns in a same layer as the first electrodes and the first active patterns forming the second electrodes and the gates in the same layer above the first electrode and the active patterns, further includes: forming second gates in a same layer as the second electrodes and the first gates forming the sources and the drains above the second electrode and the gates, further includes: forming second sources and second drains in a same layer as the first sources and the first drains, each second source and a corresponding second drain being coupled to a corresponding second active pattern; and the corresponding second drain being coupled to a corresponding second electrode, and being coupled to a corresponding third electrode.

In some embodiments of the present disclosure, forming the third electrodes on the base substrate, further includes: forming light-shielding patterns disposed in a same layer as the third electrodes, wherein the third electrodes and the light-shielding patterns are formed through a single patterning process, and orthographic projections of the first active patterns and the second active patterns that are to be formed above the base substrate are located within an orthographic projection of the light shielding patterns on the base substrate.

In some embodiments of the present disclosure, the first electrodes are made of oxide conductors formed by performing a conductor treatment on predetermined electrode patterns respectively. A material of the predetermined electrode patterns is an oxide semiconductor, and the predetermined electrode patterns are formed by using a same patterning process as at least the first active patterns.

In some embodiments of the present disclosure, the second electrodes are formed by using a same patterning process as at least the first gates.

In a third aspect, a display device is provided. The display device includes the array substrate provided in the first aspect.

BRIEF DESCRIPTION OF THE DRAWINGS

In order to describe technical solutions in embodiments of the present disclosure more clearly, the accompanying drawings to be used in the description of embodiments will be introduced briefly. Obviously, the accompanying drawings to be described below are merely some embodiments of the present disclosure, and a person of ordinary skill in the art can obtain other drawings according to these drawings without paying any creative effort.

DETAILED DESCRIPTION

The technical solutions in embodiments of the present disclosure will be described clearly and completely with reference to the accompanying drawings in embodiments of the present disclosure. Obviously, the described embodiments are merely some but not all of embodiments of the present disclosure. All other embodiments obtained on the basis of the embodiments of the present disclosure by a person of ordinary skill in the art shall be included in the protection scope of the present disclosure.

It will be understood that the terms "first", "second" and similar terms used in the description and the claims of the present disclosure are not intended to mean any order, quantity or importance, and are merely used to distinguish different components. The words "include" or "comprise", etc. are intended to mean that an element or object that precedes the word includes an element or object listed after the word and equivalents thereof, and does not exclude other element or object. Orientations or positional relationships indicated by terms "upper/above", "lower/below", etc. are based on orientations or positional relationships shown in the accompanying drawings, merely for facilitating a simplified description of some embodiments of the present disclosure, but not to indicate or imply that the referred devices or elements must have a particular orientation, or must be constructed or operated in a particular orientation. Therefore they should not be construed as limitations to the present disclosure.

Figure 3:
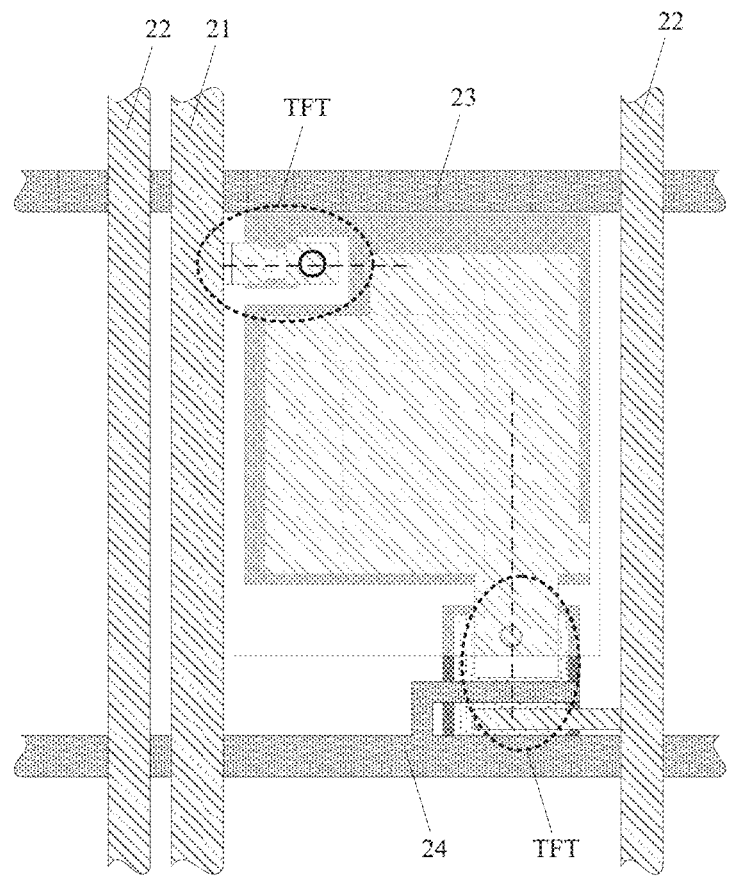
FIG. 3 is a schematic top view showing a local structure of an array substrate in the related art.

In the related art, referring to FIG. 3, a power line (VDD) 21, a data line (Data) 22, and two adjacent gate lines (Gate) 23, 24 are arranged crosswise to define a pixel unit, and the pixel unit includes two thin film transistors TFT.

Figure 4:
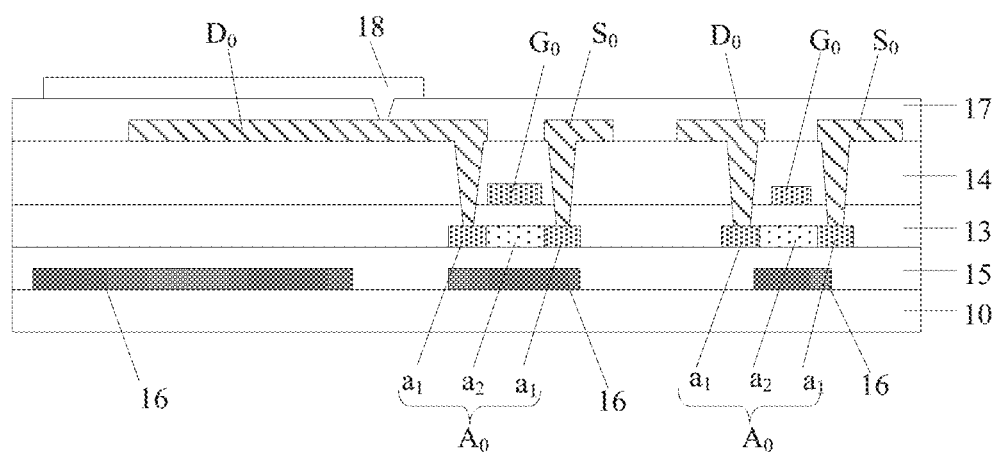
FIG. 4 is a cross-sectional structural view of the array substrate along section lines (dashed lines) in FIG. 3.

In a case where thin film transistors in the array substrate have a top gate structure, referring to FIG. 4, structures disposed on the base substrate 10 in the array substrate sequentially include a light-shielding (LS) layer 16, a buffer layer 15, active patterns A0 of the thin film transistors TFT, a gate insulating layer 13, gates $G_0$ of the thin film transistors TFT, an interlayer insulating (ILD) layer 14, sources S0 and drains $D_0$ of the thin film transistors TFT, a planarization layer 17 and pixel electrodes (Pixel ITO) 18. Portions in the active patter $A_0$ coupled to the source $S_0$ and the drain $D_0$ may be conductorized oxide conductors, labeled as $a_1$ in FIG. 4, and the remaining portion is an oxide semiconductor, labeled as $a_2$ in FIG. 4.

Figure 5:
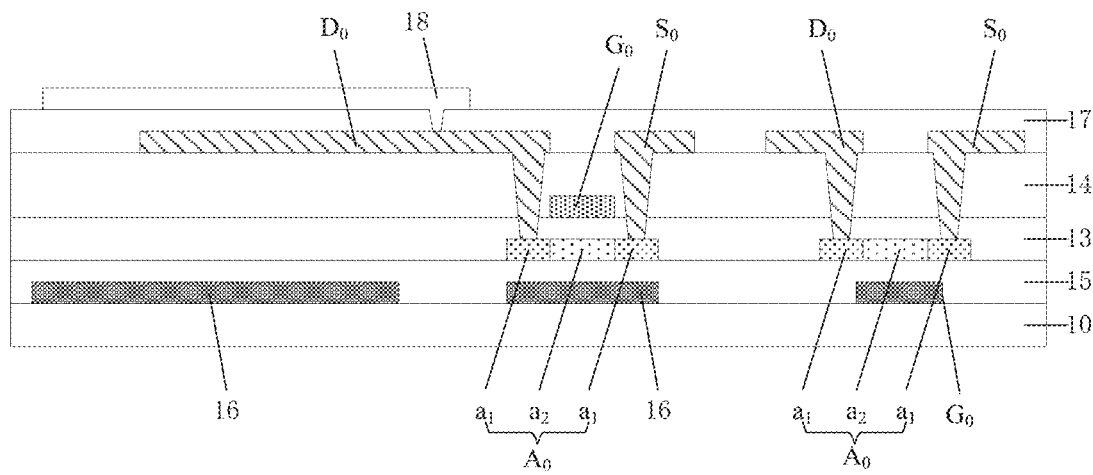
FIG. 5 is a cross-sectional structural view of the array substrate along section lines (dashed lines) in FIG. 3, in accordance with some embodiments.

In a case where some of thin film transistors in the array substrate have a bottom gate structure and remaining thin film transistors in the array substrate have a top gate structure, referring to FIG. 5, structures disposed on the base substrate 10 in the array substrate sequentially include a light-shielding layer 16, gates $G_0$ of the thin film transistors TFT, a buffer layer 15, active patterns $A_0$ of the thin film transistors TFT, a gate insulating layer 13, gates $G_0$ of the thin film transistors TFT, an interlayer insulating layer 14, sources $S_0$ and drains $D_0$ of the thin film transistors TFT, a planarization layer 17 and pixel electrodes (Pixel ITO) 18. Portions in the active pattern $A_0$ coupled to the source $S_0$ and the drain $D_0$ may be conductorized oxide conductors, labeled as $a_1$ in FIG. 5, and the remaining portion is an oxide semiconductor, labeled as $a_2$ in FIG. 5.

It will be noted that, as shown in FIG. 4 and FIG. 5, regardless of structures of the thin film transistors in the array substrate, a storage capacitor in the pixel unit is composed of portions of two conductive layers that overlap with each other and an intermediate insulating layer therebetween. The two conductive layers, for example, are a light-shielding layer 16 of a metal material and the drain D0 of the thin film transistor. However, when a region where a pixel driving circuit in the pixel unit is located is getting smaller and smaller, an area of the portions of the two conductive layers that overlap with each other will be also reduced. That is, a capacitance of the storage capacitor may be reduced, and display requirements of a high PPI (pixels per inch, i.e., the number of pixel units per inch) may not be satisfying.

Some embodiments of the present disclosure provide an array substrate. The array substrate includes a base substrate and a plurality of pixel units disposed on a base substrate. At least one pixel unit includes a plurality of thin film transistors, a first electrode, and a second electrode. At least one thin film transistor includes an active pattern, a gate, a source and a drain. The active pattern is disposed above the base substrate, and the gate is disposed at a side of the active pattern away from the base substrate. The source and the drain are disposed at a side of the gate away from the base substrate, and the source and the drain are coupled to the active pattern. The first electrode is disposed in a same layer as the active pattern, and the first electrode is coupled to the drain. The second electrode is disposed in a same layer as the gate. Orthographic projections of any two in a group consisting of the first electrode, the second electrode, and the drain on the base substrate have an overlapping region.

It will be noted that, since a source and a drain of a transistor are generally symmetrical in structure and composition, the source and the drain thereof are indistinguishable. In some embodiments, in order to distinguish the two electrodes of the transistor except a gate, one is referred to as a source and the other is referred to as a drain. Description "the orthographic projections have an overlapping region" means that the orthographic projections overlap with each other.

In a thin film transistor with a top gate structure, there are more insulating layers among conductive layers, and capacitors can be formed by using appropriate electrode patterns among the insulating layers, thereby forming a storage capacitor with a large capacitance in a limited area in the pixel unit to meet the display requirements of the high PPI. Therefore, in some embodiments, all of the thin film transistors in the pixel unit are thin film transistors with a top gate structure, in which the gate is disposed above the active pattern, but the embodiments are not limited thereto. It will be understood that, one or more of the thin film transistors in the pixel unit are the top gate thin film transistors, as long as a storage capacitor with a large capacitance can be formed in the pixel unit to meet the display requirements of the high PPI.

Figure 1:
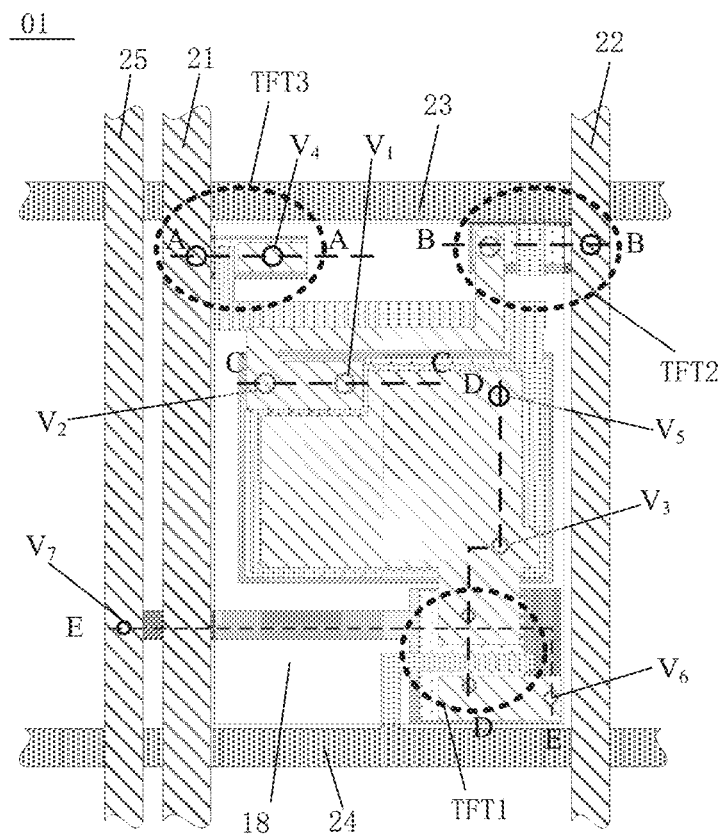
FIG. 1 is a schematic top view showing a local structure of an array substrate, in accordance with some embodiments.
Figure 2A:
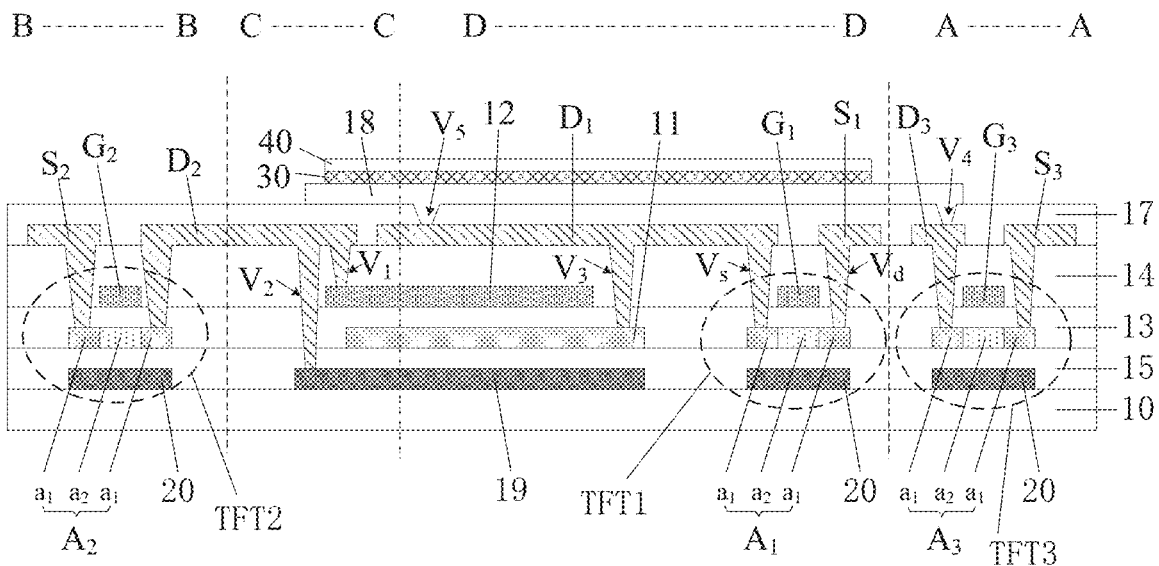
FIG. 2A is a cross-sectional structural view of the array substrate along section lines (dashed lines, which are labeled as A-A, B-B, C-C, and D-D) in FIG. 1, in accordance with some embodiments.

FIG. 1 is a schematic top view showing a local structure of an array substrate, in accordance with some embodiments, and FIG. 2A is a schematic cross-sectional view of the array substrate along section lines (labeled as A-A, B-B, C-C, and D-D) in FIG. 1, in accordance with some embodiments.

As shown in FIGS. 1 and 2A, in some embodiments, the array substrate 01 includes a plurality of pixel units disposed on a base substrate 10. At least one pixel unit includes a first thin film transistor TFT1. The first thin film transistor TFT1 includes a first active pattern $A_1$, a first source $S_1$, a first drain $D_1$, and a first gate $G_1$. The first gate $G_1$ is disposed at a side of the first active pattern $A_1$ away from the base substrate 10. The first source $S_1$ and the first drain $D_1$ are disposed at a side of the first gate $G_1$ away from the base substrate 10, and the first source $S_1$ and the first drain $D_1$ are coupled to the first active pattern $A_1$. The pixel unit further includes: a first electrode 11 disposed in a same layer as the first active pattern $A_1$; and a second electrode 12 disposed in a same layer as the first gate $G_1$. The first drain $D_1$ is coupled to the first electrode 11. Orthographic projections of any two in a group consisting of the first electrode 11, the second electrode 12, and the first drain $D_1$ on the base substrate have an overlapping region.

Referring to FIG. 2A, in the TFT with a top gate structure, the source and the drain are located above the gate, so in the first thin film transistor TFT1, the first source $S_1$ and the first drain $D_1$ is coupled to the first active pattern $A_1$ below through the respective via holes.

It will be understood that the via holes are formed through the insulating layer(s) (the specific number of layers is not limited) between the first active pattern $A_1$ and both of the first source $S_1$ and the first drain $D_1$.

Referring to FIG. 2A, in some embodiments, the array substrate 01 further includes the gate insulating layer 13 and the interlayer insulating layer 14, which are disposed between the first active pattern $A_1$ and both of the first source $S_1$ and the first drain $D_1$, and arranged away from the base substrate 10 in sequence, which is not limited in some embodiments of the present disclosure.

The description "in a same layer" means that at least two kinds of patterns can be formed through a same film forming process, or at least two kinds of patterns are in contact with a same film layer.

For example, as shown in FIG. 2A, in the pixel unit, the first electrode 11 and the first active pattern $A_1$ are disposed in the same layer on the buffer layer 15 of the array substrate 01, and the second electrode 12 and the first gate $G_1$ are disposed in the same layer on the gate insulating layer 13.

In the pixel unit, the three conductive layers, i.e., the first electrode 11, the second electrode 12 and the first drain $D_1$ are located in different layers, and orthographic projections of any two in a group consisting of the first electrode 11, the second electrode 12, and the first drain $D_1$ on the base substrate 10 have an overlapping region. The first electrode 11 at a lower side of the second electrode 12 is coupled to the first drain $D_1$ at an upper side of the second electrode 12 along a direction perpendicular to a plane where the base substrate 10 is located (i.e., along a thickness direction of the substrate 10), so that a capacitor is formed by portions of the second electrode 12 and the first electrodes 11 that overlap and another capacitor is formed by portions of the second electrode 12 and the first drain $D_1$ that overlap. The capacitors constitute a storage capacitor Cs in the pixel unit together.

Compared with the pixel unit in the array substrate shown in FIGS. 3 and 4, in the pixel unit of the array substrate provided by some embodiments of the present disclosure, the first electrode 11 disposed in the same layer as the first active pattern $A_1$ is added into the array substrate, the second electrode 12 disposed in the same layer as the first gate $G_1$ is added into the array substrate, and orthographic projections of any two of the first electrode 11, the second electrode 12, and the first drain $D_1$ on the base substrate 10 overlap, so that capacitors can be formed by the three conductive layers. The capacitors constitute one storage capacitor Cs in the pixel unit together.

Since the storage capacitor is at least composed of portions of the second electrode 12 and the first electrode 11 that overlap and portions of the second electrode 12 and the first drain $D_1$ that overlap along the direction perpendicular to the plane where the array substrate is located (that is, along a thickness direction of the array substrate). Therefore, the effective overlap area of the storage capacitor along the thickness direction of the base substrate 10 is enlarged, thereby effectively increasing the capacitance of the storage capacitor in a limited pixel unit to meet the design requirements of the high PPI. In the storage capacitor composed of the light-shielding layer 16 of a metal material and the drain electrode D0 of the thin film transistors, since there are a plurality of insulating layers in the storage capacitor, the total thickness of the insulating layers are larger, and the capacitance of the storage capacitor may be decreased. In some embodiments of the present disclosure, since a thickness of an insulating layer between the first electrode 11 and the second electrode 12 (for example, the gate insulating layer 13) and a thickness of an insulating layer between the second electrode 12 and the first drain $D_1$ (for example, the interlayer insulating layer 14) are thin, the capacitance of a capacitor formed by every two adjacent electrodes may be large, so that the capacitance of the storage capacitor may be further increased.

To further increase a capacitance of the storage capacitor Cs, in some embodiments, referring to in FIG. 2A, the pixel unit further includes a third electrode 19. The third electrode 19 is disposed between the first electrode 11 and the base substrate 10, and the third electrode 19 is coupled to the second electrode 12. Orthographic projections of any two of the third electrode 19, the first electrode 11, the second electrode 12, and the first drain $D_1$ on the base substrate 10 have an overlapping region.

The orthographic projections of any two of the third electrode 19, the first electrode 11, the second electrode 12, and the first drain $D_1$ on the base substrate 10 have an overlapping region, the first electrode 11 and the first drain $D_1$ are coupled, and the third electrode 19 and the second electrode 12 are coupled, so that a part of a capacitance exists between the third electrode 19 and the first electrode 11, another part of the capacitance exists between the first electrode 11 and the second electrode 12, and yet another part of the capacitance exists between the second electrode 12 and the first drain $D_1$. Therefore, the storage capacitor in the pixel unit is a capacitor formed of the four conductive layers, i.e., the third electrode 19, the first electrode 11, the second electrode 12, and the first drain $D_1$, which has a large capacitance.

As shown in FIG. 2A, the orthographic projections of the third electrode 19, the first electrode 11, the second electrode 12, and the first drain $D_1$ on the base substrate 10 have an overlapping region, so that the area occupied by the storage capacitor may be saved, and the PPI may be increased.

In some embodiments, as shown in FIG. 2A, the pixel unit further includes a second thin film transistor TFT2. The second thin film transistor TFT2 includes a second active pattern $A_2$, a second source $S_2$, a second drain $D_2$ and a second gate $G_2$. The second source $S_2$ and the second drain $D_2$ are coupled to the second active pattern $A_2$. The second active pattern $A_2$ is disposed in a same layer as the first active pattern $A_1$. The second source $S_2$, the second drain $D_2$, the first source $S_1$, and the first drain $D_1$ are disposed in a same layer. The second gate $G_2$ is disposed in a same layer as the first gate $G_1$. The second drain $D_2$ is coupled to the second electrode 12, and the second drain $D_2$ is coupled to the third electrode 19.

As shown in FIG. 2A, in the second thin film transistor TFT2, the second source $S_2$ and the second drain $D_2$ are coupled to the second active pattern $A_2$ through different via holes.

For example, as shown in FIG. 2A, the second source $S_2$ is coupled to the second active pattern $A_2$ through a source via hole $V_s$, and the second drain $D_2$ is coupled to the second active pattern $A_2$ through a drain via hole $V_d$.

Referring to FIG. 2A, the insulating layers between the second active patter $A_2$ and both of the second source $S_2$ and the second drain $D_2$ may include the gate insulating layer 13 and the interlayer insulating layer 14 arranged away from the base substrate 10 in sequence. Some embodiments of the present disclosure are not limited thereto.

In some embodiments, the active patterns in the first thin film transistor TFT1 and the second thin film transistor TFT2 are made of oxide semiconductor materials (for example, IGZO). Referring to FIG. 2A, in some embodiments, the pixel unit further includes light-shielding patterns 20, and the light-shielding patterns 20 are disposed in a same layer as the third electrode 19. Orthographic projections of the first active pattern $A_1$ and the second active pattern $A_2$ on the base substrate 10 are located within an orthographic projection of the light-shielding patterns 20 on the base substrate 10.

In some embodiments, referring to FIG. 2A, the light-shielding pattern 20 may be in the same layer as the third electrode 19 but independent of each other; or the light-shielding pattern 20 may be coupled to the third electrode 19 to form an integral structure, which is not limited in some embodiments of the present disclosure.

In some embodiments, the material of the first active pattern $A_1$ is an oxide semiconductor, and the material of the first electrode 11 is an oxide conductor. Since the oxide conductor may be an oxide conductor obtained by performing a conductor treatment on an oxide semiconductor, the first electrode 11 can be formed in a same patterning process as the first active pattern $A_1$. In some embodiments, the materials of the first gate $G_1$ and the second electrode 12 are the same, which allows the first gate $G_1$ and the second electrode 12 to be formed in a same patterning process. In some embodiments, the materials of the light-shielding pattern 20 and the third electrode 19 are the same, and the material of the light-shielding pattern 20 is metal, so that the light-shielding pattern 20 and the third electrode 19 may be formed in a same patterning process.

Referring to FIG. 2A, for example, arrangement manners of the insulating layers among the electrode layers and the via holes extending through the insulating layers are as follows. The third electrode 19 and the light-shielding pattern 20 are disposed on the base substrate 10, and the base substrate 10 is a glass substrate or a PI substrate. The third electrode 19 and the light-shielding pattern 20 are isolated from the first active patter $A_1$, the second active pattern $A_2$, and the first electrode 11 through the buffer layer 15. The first active pattern $A_1$, the second active pattern $A_2$ and the first electrode 11 are isolated from the first gate $G_1$, the second gate $G_2$, and the second electrode 12 through the gate insulating layer 13. The first gate $G_1$, the second gate $G_2$, and the second electrode 12 are isolated from the first source $S_1$, the first drain D1, the second source $S_2$, and the second drain $D_2$ through the interlayer insulating layer 14. The second drain $D_2$ is coupled to the second electrode 12 through a first via hole $V_1$ extending through the interlayer insulating layer 14. The second drain $D_2$ is coupled to the third electrode 19 through the second via hole $V_2$ extending through the interlayer insulating layer 14, the gate insulating layer 13, and the buffer layer 15. The first drain $D_1$ is coupled to the first electrode 11 through a third via hole $V_3$ extending through the interlayer insulating layer 14 and the gate insulating layer 13.

In order to reduce the difficulty of forming the second via hole $V_2$, and ensure that the second drain electrode $D_2$ is coupled to the third electrode 19 through the second via hole $V_2$, in some embodiments, the pixel unit further includes a first interconnecting pattern disposed in a same layer as the second electrode 12. Referring to FIG. 2D, the second via hole $V_2$ includes a first sub via hole $V_{S1}$ and a second sub via hole $V_{S2}$, the first sub via hole $V_{S1}$ extends through the interlayer insulating layer 14, and the second sub via hole $V_{S2}$ extends through the gate insulating layer 13 and the buffer layer 15. The second drain $D_2$ is coupled to the first interconnecting pattern through the first sub via hole $V_{S1}$, and the first interconnecting pattern is coupled to the third electrode 19 through the second sub via hole $V_{S2}$.

In a case where the base substrate 10 is a substrate made of flexible material such as Polyimide (PI), due to the high temperature during a manufacturing process of the array substrate, impurity ions may easily escape from the flexible material, affecting the performance of the active patterns of the TFTs above the base substrate 10. In this case, the buffer layer 15 covering the base substrate 10 is used to isolate the escaped impurity ions.

In some embodiments, as shown in FIG. 1, the pixel unit further includes a third thin film transistor TFT3 and a pixel electrode 18. A third gate G3 of the third thin film transistor TFT3 is coupled to the second electrode 12. The third thin transistor TFT3 is configured to be turned on in a case where the storage capacitor is fully charged. Referring to FIG. 2A, the third drain $D_3$ of the third thin film transistor TFT3 is coupled to the pixel electrode 18 through a fourth via hole $V_4$ extending through the planarization layer 17 of the array substrate 01, and the first drain $D_1$ of the first thin film transistor TFT1 is coupled to the pixel electrode 18 through a fifth via hole $V_5$ extending through the planarization layer 17.

In some embodiments, the pixel unit further includes a light-emitting functional layer 30 and a fourth electrode 40 sequentially disposed above the pixel electrode 18. The pixel electrode 18, the light-emitting functional layer 30, and the fourth electrode 40 constitute a light-emitting component. The third thin film transistor TFT3 is a driving thin film transistor that drives the light-emitting component to emit light. In this case, the first thin film transistor is a compensation thin film transistor, and the second thin film transistor is a switching thin film transistor.

In some embodiments, the array substrate is an organic light-emitting display (OLED) array substrate applied to the OLED display device. The pixel electrode is, for example, an anode of the light-emitting component, and the fourth electrode 40 is, for example, a cathode of the light-emitting component.

For example, the light-emitting component is an OLED device.

In some embodiments, the array substrate further includes a pixel defining layer disposed on the planarization layer, and openings are formed in the pixel defining layer for exposing the lower pixel electrodes. A light-emitting functional layer 30 of a light-emitting component is disposed in a corresponding opening, so that the light-emitting functional layer 30 is isolated from a light-emitting functional layer 30 of an adjacent pixel unit.

The arrangements of the pixel electrode, the fourth electrode 40, and the pixel defining layer are not limited to the above case.

In some embodiments, referring to FIG. 1, the array substrate further includes power lines 21, data lines 22 and sense lines 25, all of which are disposed in a same layer as the source and the drain of each thin film transistor, and first scan lines 23 and second scan lines 24, all of which are disposed in a same layer as the gate of each thin film transistor. It will be noted that, FIG. 1 shows only a power line 21, a data line 22, a sense line 25, a first scan line 23 and a second scan line 24 for illustration purposes, all of which are connected to a pixel unit.

Referring to FIGS. 1, 2A, 2B, and 2C, the first source $S_1$ of the first thin film transistor TFT1 is coupled to the sense line 25, the first drain $D_1$ is coupled to the first electrode 11 through the third via hole V3, and the first gate $G_1$ is coupled to the second scan line 24.

Figure 2B:
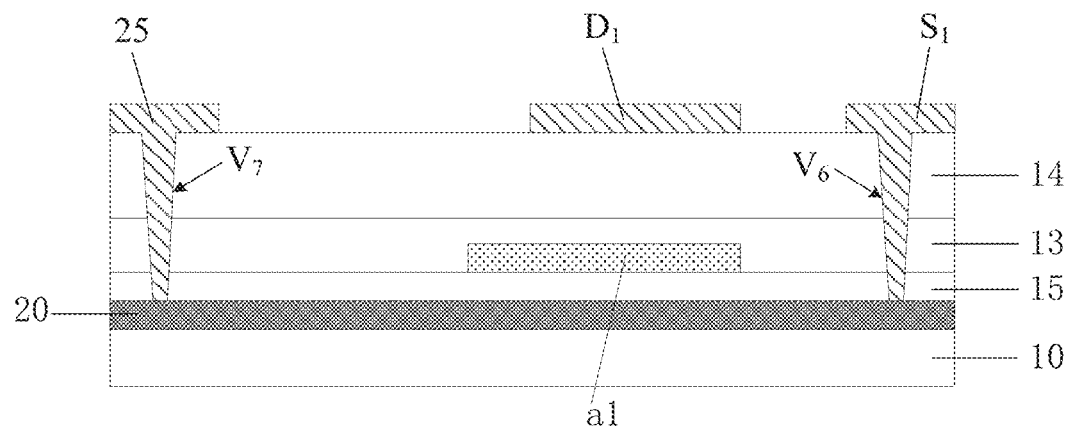
FIG. 2B is a cross-sectional structural view of the array substrate along a section line (labeled as E-E) in FIG. 1, in accordance with some embodiments.

In some embodiments, as shown in FIG. 2B, the first source electrode $S_1$ is coupled to the light-shielding pattern 20 disposed at a side of the first active pattern $A_1$ proximate to the base substrate 10 through a sixth via hole $V_6$ extending through the interlayer insulating layer 14, the gate insulating layer 13, and the buffer layer 15. The light-shielding pattern 20 is also coupled to the sense line 25 through a seventh via hole $V_7$ extending through the interlayer insulating layer 14, the gate insulating layer 13 and and the buffer layer 15.

Figure 2C:
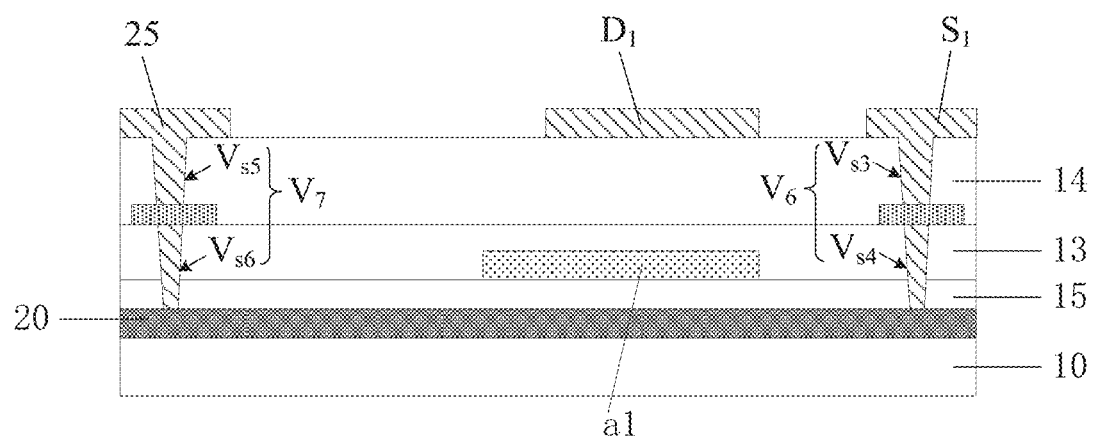
FIG. 2C is another cross-sectional structural view of the array substrate along a section line (labeled as E-E) in FIG. 1, in accordance with some embodiments.
Figure 2D:
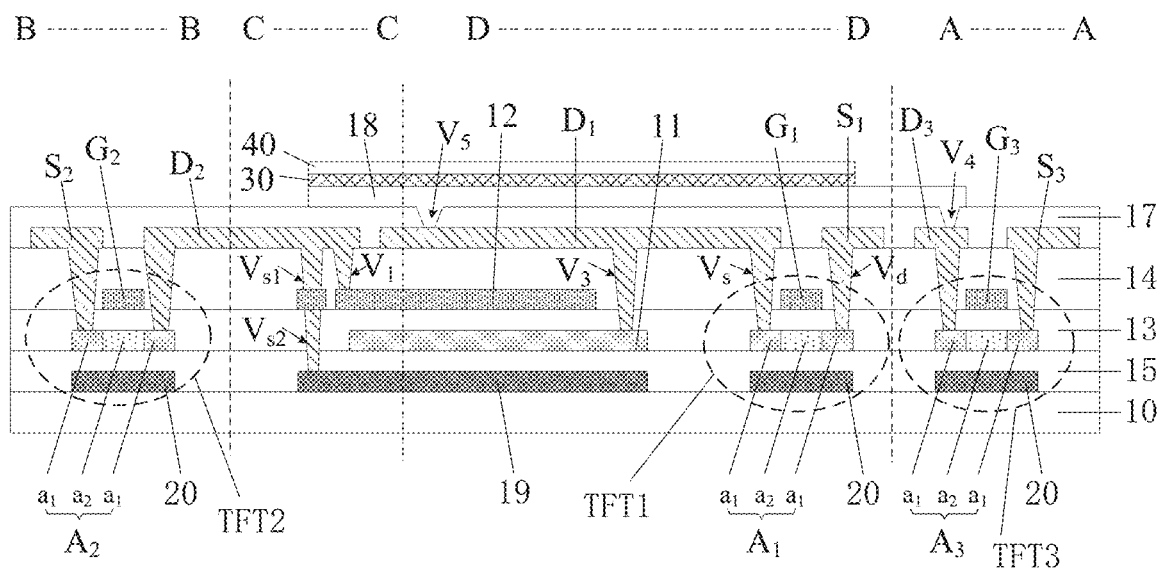
FIG. 2D is another cross-sectional structural view of the array substrate along section lines (dashed lines, which are labeled as A-A, B-B, C-C, and D-D) in FIG. 1, in accordance with some embodiments.

In some embodiments, referring to FIG. 2C, the sixth via hole $V_6$ includes a third sub via hole $V_{S3}$ and a fourth sub via hole $V_{S4}$, the seventh via hole $V_7$ includes a fifth sub via hole $V_{S5}$ and a sixth sub via hole $V_{S6}$. The first source $S_1$ of the first thin film transistor TFT1 is coupled to a second interconnecting pattern of the pixel unit through the third sub via hole $V_{S3}$ extending through the interlayer insulating layer 14, and the second interconnectiong pattern is coupled to the light-shielding pattern 20 through the fourth sub via hole $V_{S4}$ extending through the gate insulating layer 13 and the buffer layer 15. A third interconnecting pattern of the pixel unit is coupled to the sense line 25 through the fifth sub via hole $V_{S5}$ extending through the interlayer insulating layer 14, and the light-shielding pattern 20 is coupled to the third interconnecting pattern through the sixth sub via hole $V_{S5}$ extending through the gate insulating layer 13 and the buffer layer 15.

The second source $S_2$ of the second thin film transistor TFT2 is coupled to the data line 22 (the second source $S_2$ may be a part of the data line 22). The second drain $D_2$ is coupled to the second electrode 12 through the first via hole $V_1$, and is coupled to the third electrode 19 through the second via hole $V_2$. The second gate $G_2$ is coupled to the first scan line 23. The third source $S_3$ of the third thin film transistor TFT3 is coupled to the power source line 21 (the third source $S_3$ may be a part of the power line 21), the third drain $D_3$ is coupled to the pixel electrode 18 through the fourth via hole $V_4$ (the first drain $D_1$ is coupled to the pixel electrode 18 through the fifth via hole $V_5$), and the third gate $G_3$ is coupled to the second electrode 12 disposed in the same layer as the third gate $G_3$, so that the third thin film transistor TFT3 is turned on when the storage capacitor is fully charged.

Figure 6:
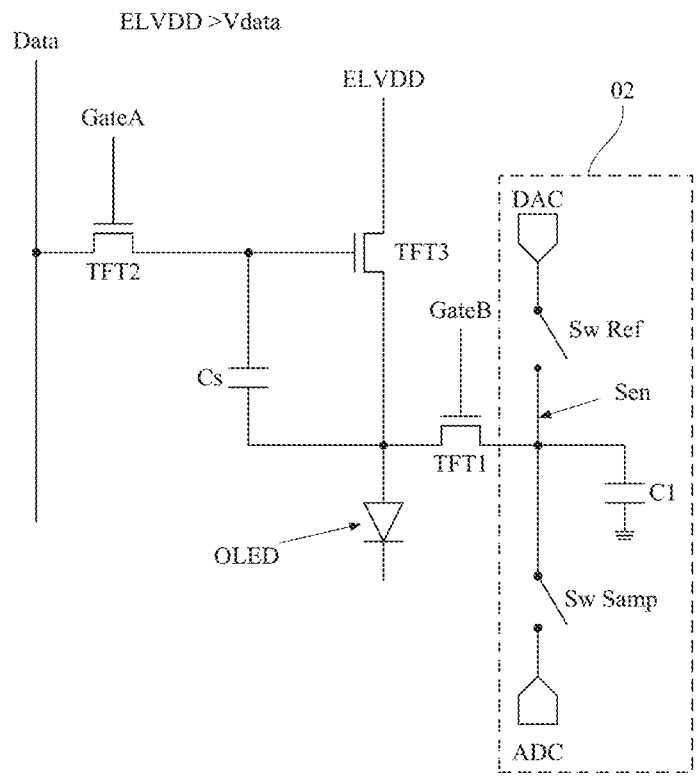
FIG. 6 is an equivalent circuit diagram of a pixel unit in an array substrate, in accordance with some embodiments.

FIG. 6 is an equivalent circuit diagram of a pixel unit in an array substrate provided by some embodiments of the present disclosure. In FIG. 6, Data represents the data line, ELVDD represents the power line, and Sen represents the Sense line; GateA and GateB respectively represent the first scan line and the second scan line; Cs represents the storage capacitor formed by four conductive layers, i.e., the third electrode, the first electrode, the second electrode, and the first drain, which overlap each other; OLED represents the light-emitting component; and 02 represents an external compensation IC, and DAC represents a digital-to-analog converter, which is a device that converts a digital signal into an analog signal; Sw Ref represents a switch of reference current; an ADC represents an analog-to-digital converter, which is a device that converts a continuous varying analog signal into a discrete digital signal; Sw Samp represents a switch of actual current; and C1 represents a grounded capacitor in the external compensation circuit. A specific structure of the external compensation IC is not limited in the embodiments of the present disclosure, and FIG. 6 is just an example.

In a display period, the second thin film transistor TFT2 is turned on to charge the storage capacitor Cs. After charging is completed, the third thin film transistor TFT3 is turned on under control of the storage capacitor Cs, and the voltage applied to the light-emitting component OLED by the power line ELVDD is greater than the voltage applied to the light-emitting component OLED by the data line Data, and thus the light-emitting component OLED is driven to emit light. In a sensing period, the first thin film transistor TFT1 is turned on to transmit a threshold voltage (Vth) of the third thin film transistor TFT3 to the external compensation IC, and the external compensation IC may compensate for a driving voltage of the light-emitting component OLED according to a difference between the Vth and a reference value, in order to compensate for a difference in display luminance of the pixel unit due to a difference in threshold voltage drift amount, thereby achieving a purpose of real-time compensation for the light-emitting component OLED.

Some embodiments of the present disclosure provide a method of manufacturing the array substrate. The method includes but is not limited to the following steps.

In S1, first electrodes 11 and first active patterns $A_1$ are formed in a same layer above the base substrate 10.

In some embodiments, it is not limited to only forming the first electrodes 11 and the first active patterns $A_1$ when S1 is performed, and the second active patterns $A_2$ may also be formed, and even the third active patterns $A_3$ may be formed. In other words, the first electrodes 11 and a plurality of active patterns, all of which are disposed in a same layer, can be formed when S1 is performed.

It will be noted that, the first electrodes 11 and the first active patterns $A_1$ are disposed above the base substrate 10, and other patterns, and/or other film layers may be disposed between all of the first electrodes 11 and the first active patterns $A_1$, and the base substrate 10. The embodiments are not limited thereto.

In S2, the second electrodes 12 and the first gates $G_1$ are formed in a same layer above the first electrodes 11 and the first active patterns $A_1$.

In some embodiments, it is not limited to only forming the second electrodes 12 and the first gates $G_1$ when S2 is performed, and the second gates $G_2$ may also be formed, and even the third gates $G_3$ may be formed. In other words, the second electrodes 12 and a plurality of gates, all of which are disposed in the same layer, may be formed when S2 is performed, and the plurality of gates are in one-to-one correspondence with the plurality of active patterns formed in S1.

In S3, the first sources S1 and the first drains $D_1$ are formed above the second electrodes 12 and the first gates $G_1$, and the first source S1 and the first drain $D_1$ are coupled to the first active pattern $A_1$ through the respective via holes.

In some embodiments, it is not limited to only forming the first sources S1 and the first drains $D_1$ when S3 is performed, and the second sources $S_2$ and the second drains $D_2$ may also be formed, and even the third sources $S_3$ and the third drains $D_3$ may be formed. In other words, a plurality of sources and a plurality of drains may be formed when S3 is performed, and each source and a corresponding drain are coupled to a corresponding active pattern through the respective via holes.

A set of an active pattern, a gate, a source and a drain constitute a thin film transistor. For example, the first active pattern $A_1$, the first gate $G_1$, the first source $S_1$, and the first drain $D_1$ constitute the first thin film transistor TFT1. The second active pattern $A_2$, the second gate $G_2$, the second source $S_2$ and the second drain $D_2$ constitute the second thin film transistor TFT2. The third active pattern $A_3$, the third gate $G_3$, the third source $S_3$, and the third drain $D_3$ constitute the third thin film transistor TFT3.

The first drain $D_1$ is coupled to the first electrode 11 through the third via hole $V_3$. The second drain $D_2$ is coupled to the second electrode 12 through the first via hole, and the second drain $D_2$ is coupled to the third electrode 19 through the second via hole. The third gate $G_3$ is coupled to the second electrode 12, so that the third thin film transistor TFT3 is turned on when the storage capacitor Cs is fully charged.

Orthographic projections of any two in a group consisting of the first electrode 11, the second electrode 12, and each drain of at least one drain on the base substrate have an overlapping region, and the first electrode 11 is coupled to the drain. For example, orthographic projections of any two of the first electrode 11, the second electrode 12, and the first drain $D_1$ on the base substrate 10 have an overlapping region, and the first electrode 11 is coupled to the first drain $D_1$, so that the three conductive layers can form capacitors. The capacitors constitute a storage capacitor Cs in the pixel unit together.

In some embodiments, in order to further increase the capacitance of the storage capacitor Cs, before the S1, the method further includes S1'.

In S1', the third electrodes 19 are formed on the base substrate 10. The third electrode 19 is disposed between the first electrode 11 and the base substrate 10. Orthographic projections of any two of the third electrode 19, the first electrode 11, the second electrode 12, and the first drain $D_1$ on the base substrate 10 have an overlapping region, and the third electrode 19 is coupled to the second electrode 12.

In some embodiments, the S1' further includes: forming the light shielding patterns 20 disposed in the same layer as the third electrodes 19 while forming the third electrodes 19 on the base substrate 10 through one patterning process the material of the light shielding pattern 20 is metal.

Orthographic projections of the first active patter $A_1$ and the second active pattern $A_2$ that are to be formed above the base substrate 10 are located within an orthographic projection of the light-shielding patterns 20 on the base substrate.

For example, on the basis of the method, as shown in FIGS. 7 to 14, a process of forming the insulating layers and the via holes in the electrode layers are:

forming the buffer layer 15 that isolates the third electrodes 19 and the light-shielding patterns 20 from the first active patterns $A_1$, the second active patterns $A_2$, and the first electrodes 11;

forming the gate insulating layer 13 that isolates the first active patterns $A_1$, the second active patterns $A_2$, and the first electrodes 11 from the first gates $G_1$, the second gates $G_2$, and the second electrodes 12; and forming the interlayer insulating layer 14 that isolates the first gates $G_1$, the second gates $G_2$, and the second electrodes 12 from the first sources $S_1$, the first drain $D_1$, the second sources $S_2$, and the second drains $D_2$.

In some embodiments, the second drain $D_2$ is coupled to the second electrode 12 through the first via hole $V_1$ extending through the interlayer insulating layer 14, and the second drain $D_2$ is coupled to the third electrode 19 through the second via hole $V_2$ extending through the interlayer insulating layer 14, the gate insulating layer 13, and the buffer layer 15. The first drain $D_1$ is coupled to the first electrode 11 through the third via hole $V_3$ extending through the interlayer insulating layer 14 and the gate insulating layer 13.

In some embodiments, the method further includes: forming the planarization layer 17 covering each source and each drain; and forming the pixel electrodes 18 on the planarization layer 17 the pixel electrode 18 is coupled to the third drain $D_3$ through the fourth via hole $V_4$ extending through the planarization layer 17, and is coupled to the first drain $D_1$ through the fifth via hole $V_5$.

In some embodiments, the method further includes: forming the light-emitting functional layers 30 and the fourth electrodes 40 on the pixel electrodes in sequence, the pixel electrode, the light-emitting functional layer 30, and the fourth electrode 40 constituting the light-emitting component.

On the basis of the above description, in some embodiments, the first electrode 11 is made of an oxide conductor formed by performing a conductor treatment on a predetermined electrode pattern. A material of the predetermined electrode pattern is the oxide semiconductor, and the predetermined electrode pattern is formed by using a same patterning process as at least the first active pattern $A_1$.

In some embodiments, the second electrode 12 is formed by using a same patterning process as at least the first gate $G_1$.

A typical patterning process refers to a process of applying a mask for one time to photo a photoresist on the surface of a film, developing the photoresist, and etching a portion of the film exposed by the photoresist to form a specific pattern and removing the photoresist.

For example, in an example where the pixel unit includes the first thin film transistor TFT1, the second thin film transistor TFT2, and the third thin film transistor TFT3, when the third electrodes 19 and the light-shielding patterns 20 are formed by using a same patterning process, the active patterns and the predetermined electrode pattern that is used for forming the first electrodes 11 are formed by using a same patterning process, and the second electrodes 12, the gates and the scan lines are formed by using a same patterning process, the problem that the capacitance of the storage capacitor in the pixel unit with a multi-TFT structure is seriously insufficient may be solved without increasing the number of original patterning processes of the array substrate (that is, the number of times the use of a mask).

A manufacturing process of the array substrate will be described in detail below.

Figure 7:
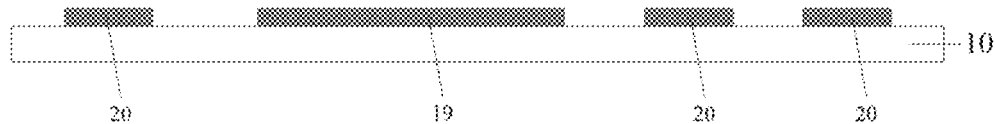
FIG. 7 is a schematic diagram showing a manufacturing process of an array substrate, in accordance with some embodiments.

In step a, as shown in FIG. 7, the third electrodes 19 each configured as a first electrode layer of the storage capacitor, and the light-shielding patterns 20 are formed on the base substrate 10 by using a single patterning process.

A material of the light-shielding patterns 20 and the third electrodes 19 is molybdenum (Mo), and a thickness thereof is, for example, 1,000 Å to 3,000 Å.

Figure 8:
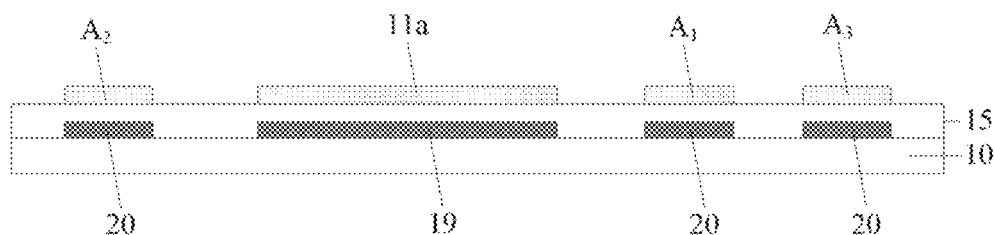
FIG. 8 is a schematic diagram showing another manufacturing process of an array substrate, in accordance with some embodiments.

In step b, as shown in FIG. 8, the buffer layer 15 and an oxide semiconductor layer are deposited, and the oxide semiconductor layer is processed by using a single patterning process to form the first active patterns $A_1$, the second active patterns $A_2$, the third active pattern $A_3$ and predetermined electrode patterns 11a. A etching process used in the patterning process is a dry etch that can form patterns with a higher precision.

In some embodiments, the light-shielding patterns 20 are disposed blow the first active pattern $A_1$, the second active pattern $A_2$, and the third active pattern $A_3$ respectively, and the third electrode 19 is disposed below the predetermined electrode pattern 11a.

Figure 9:
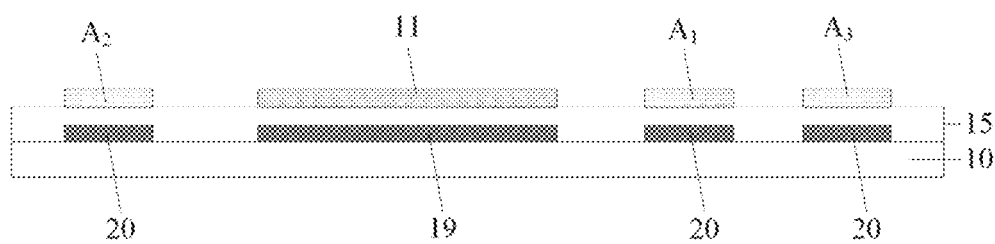
FIG. 9 is a schematic diagram showing another manufacturing process of an array substrate, in accordance with some embodiments.

In step c, as shown in FIG. 9, a conductor treatment is performed on the predetermined electrode patterns 11a to form the first electrodes 11, each of which is used as a second electrode layer of the storage capacitor.

For example, the conductor treatment may be a process of processing the oxide semiconductor to form the oxide conductor by means of ion doping (or ion implantation). The manner of ion doping includes, but is not limited to injecting NH3 plasma of a dry etch or a plasma enhanced chemical vapor deposition (PECVD) into a semiconductor.

Figure 10:
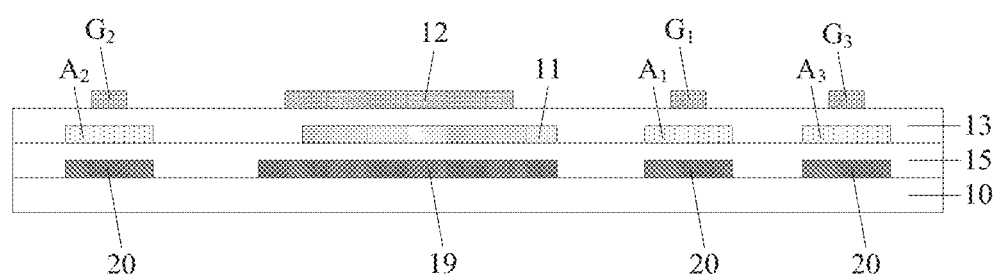
FIG. 10 is a schematic diagram showing another manufacturing process of an array substrate, in accordance with some embodiments.

In step d, as shown in FIG. 10, a single patterning process is performed on the gate insulating layer 13 and a gate metal layer are deposited, and the gate metal layer to form the first gates $G_1$, the second gates $G_2$, the third gates $G_3$, and the second electrodes 12, and each second electrode 12 is used as a third electrode layer of the storage capacitor.

In some embodiments, the gate metal layer for forming the gates and the second electrodes 12 may be a multi-layer structure, for example, a three-layer structure composed of a molybdenum-niobium alloy (MoNb, a thickness of 100 Å to 1000 Å) layer, a aluminum-niobium alloy (AlNd, a thickness of 1000 Å~8000 Å) layer, and a molybdenum-niobium alloy layer (MoNb, a thickness of 100 Å~1000 Å) that are formed in sequence.

In some embodiments, the etching process used in the patterning process is a wet etch that is more efficient in etching metal materials.

Figure 11:
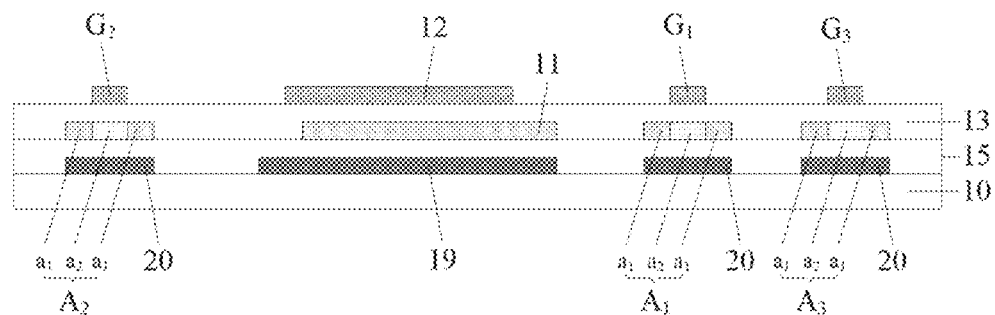
FIG. 11 is a schematic diagram showing another manufacturing process of an array substrate, in accordance with some embodiments.

In step e, as shown in FIG. 11, by using the gates as a shield, portions of an active pattern below each gate, which are not overlapped with the gate, are performed a conductor treatment to form oxide conductor portions $a_1$, so as to reduce the ohmic contact (the ohmic contact means forming a pure resistance at the contact. Generally, the smaller the resistance, the better) when each active pattern is subsequently coupled to the corresponding source and drain, thereby improving the conduction performance of the TFT. A portion of each active pattern that overlaps with the gate in a direction perpendicular to the plane where base substrate 10 is located is an untreated oxide semiconductor portion $a_2$.

Figure 12:
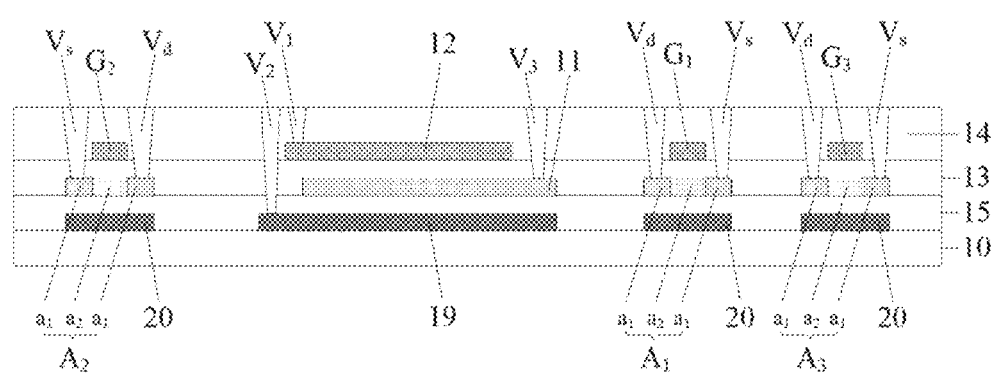
FIG. 12 is a schematic diagram showing another manufacturing process of an array substrate, in accordance with some embodiments.

In step f, as shown in FIG. 12, the interlayer insulating layer 14 is deposited and a single patterning process is performed on the interlayer insulating layer to form a source via hole and a drain via hole used for each thin film transistor TFT extending through the interlayer insulating layer 14 and the gate insulating layer 13, the first via hole $V_1$ extending through the interlayer insulating layer 14 to expose the second electrode 12, the second via hole V2 extending through the interlayer insulating layer 14, the gate insulating layer 13, and the buffer layer 15 to expose the third electrode 19, and the third via hole V3 extending through the interlayer insulating layer 14 and the gate insulating layer 13 to expose the first electrode 11.

Figure 13:
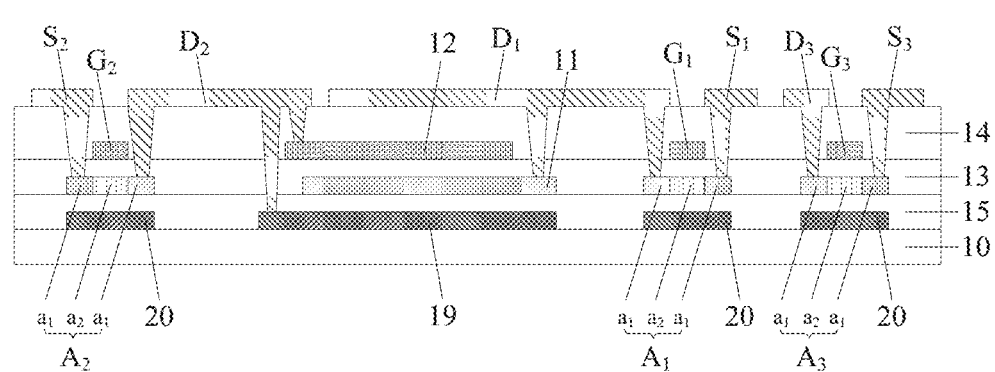
FIG. 13 is a schematic diagram showing another manufacturing process of an array substrate, in accordance with some embodiments.

In step g, as shown in FIG. 13, a SD metal layer is deposited, and a single patterning process is performed on the SD metal layer to form the first sources S1, the first drains D1, the second sources S2, the second drains $D_2$, the third sources $S_3$ and the third drains $D_3$.

Each source is coupled to an oxide conductor portion $a_1$ in a corresponding active pattern through a corresponding source via hole, and each drain is coupled to an oxide conductor portion $a_1$ in a corresponding active pattern through a corresponding drain via hole, thereby forming the first thin film transistor TFT1, the second thin film transistor TFT2, and the third thin film transistor TFT3. The first drain $D_1$ of the first thin film transistor TFT1 is coupled to the first electrode 11 below through the third via hole $V_3$, and the first drain $D_1$ is used as an electrode of a fourth capacitor. The second drain $D_2$ of the second thin film transistor TFT2 is coupled to the second electrode 12 through the first via hole $V_1$, and is coupled to the third electrode 19 through the second via hole $V_2$.

For example, the SD metal layer for forming the sources and the drains may has a multi-layer structure, for example, a three-layer structure composed of a molybdenum-niobium alloy layer (MoNb, a thickness of 100 Å-1000 Å), a aluminum-niobium alloy layer (AlNd, 1000 Å~8000 Å), and a molybdenum-niobium alloy layer (MoNb, a thickness of 100 Å to 1000 Å) that are formed in sequence.

In some embodiments, the etching process used in the patterning process is a wet etch that is more efficient in etching metal materials.

Figure 14:
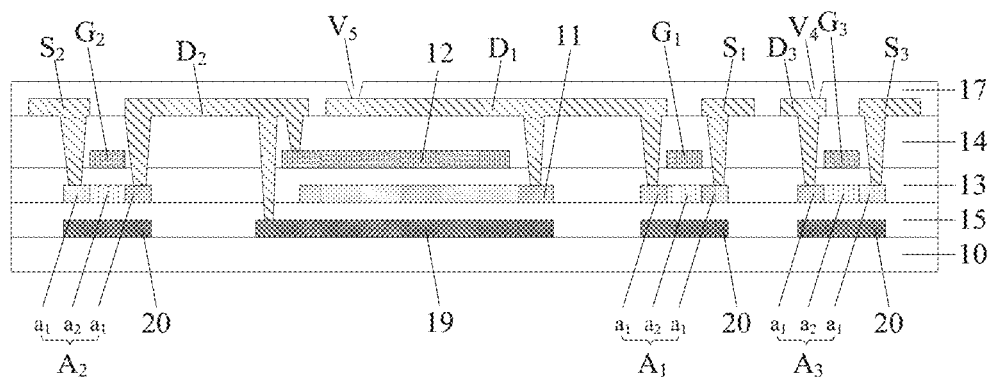
FIG. 14 is a schematic diagram showing another manufacturing process of an array substrate, in accordance with some embodiments.

In step h, as shown in FIG. 14, the planarization layer 17 is deposited, and a patterning process is performed on the planarization layer 17 to form the fourth via holes $V_4$ exposing the third drains $D_3$ below, and the fifth via holes $V_5$ exposing the first drains $D_1$.

The specific number of the planarization layers 17 is not limited and not limited to one. For example, after completing the above step g, a PVX layer and a PLN layer are sequentially deposited. The material of the PVX layer is generally a non-photoresist insulation material, and the material of the PLN layer material is generally a photoresist material. A first portion of the fourth via hole $V_4$ and the fifth via hole $V_5$ that extends through the PLN layer is formed after the PLN layer is photoed and developed through the mask; then the exposed PVX layer is etched through the etching process (Dry Etch), and a second portion of the fourth via hole $V_4$ and the fifth via hole $V_5$ that extends through the PVX layer is formed at a same position as via holes of the PLN layer, thereby forming the fourth via hole $V_4$ and the fifth via hole $V_5$ that extends through the entire planarization layer 17. In this way, the photoresist material can be utilized as a part of the planarization layer 17, and the last required photoresist ash removal process in the conventional patterning process of via holes is omitted, simplifying the manufacturing process.

In step i, the pixel electrodes 18 are formed on the planarization layer 17. Referring to FIG. 1, the pixel electrode 18 is coupled to the third drain $D_3$ through the fourth via hole $V_4$, and is coupled to the first drain $D_1$ through the fifth via hole $V_5$.

In some embodiments, the method further includes: forming the light-emitting functional layer 30 and the fourth electrodes 40 above the pixel electrodes 18 subsequently to constitute the light-emitting components, which will not be described herein again.

In some embodiments, the array substrate formed by using the method may be a top-emitting OLED substrate, that is, light emitted from the light-emitting component exits from the array substrate upward relative to the base substrate 10, so the pixel electrode 18 may has a structure in which a ITO material layer and a reflective material (such as silver, Ag) layer are stacked to improve the light extraction efficiency of the light-emitting component.

For example, a specific structure of the pixel electrode 18 may be a stacked structure of a ITO layer (100 Å~1000 Å), a Ag layer (100 Å~8000 Å), and a ITO layer (100 Å~1000 Å).

Through the above method, the problem that the capacitance of the storage capacitor in the pixel unit with a multi-TFT structure is seriously insufficient may be solved without increasing the number of original patterning processes of the array substrate (that is, the number of using a mask).

Figure 15:
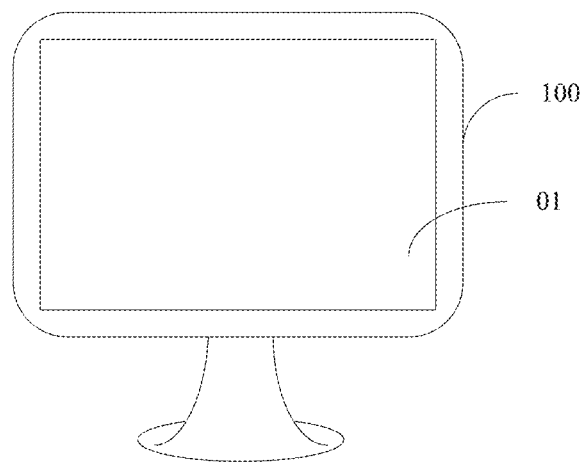
FIG. 15 is a schematic diagram of a display apparatus, in accordance with some embodiments.

As shown in FIG. 15, some embodiments of the present disclosure provide a display device 100. The display device 100 includes the array substrate 01 described in any one of the above embodiments.

The display device may be an OLED display device, may also be any product or component having a display function such as an OLED display, an OLED TV, a mobile phone, a tablet computer, a smart watch, a digital photo frame, or a navigator.

It will be understood that in some embodiments of the present disclosure, although the description is made by taking an example in which the first source of the first thin film transistor is coupled to the sense line, the first drain of the first thin film transistor is coupled to the first electrode, the second source of the second thin film transistor is coupled to the data line, the second drain of the second thin film transistor is coupled to the second electrode and the third electrode, the third source of the third thin film transistor is coupled to the power line, and the third drain of the third thin film transistor and the first drain of the first thin film transistor are coupled to the pixel electrode, those skilled in the art should understand that, due to the interchangeability in structure and composition between the source and the drain of the thin film transistor, it can also be set that the first drain of the first thin film transistor is coupled to the sense line, the first source of the first thin film transistor is coupled to the first electrode, and the second drain of the second thin film transistor is coupled to the data line, the second source of the second thin film transistor is coupled to the second electrode and the third electrode, the third drain of the third thin film transistor is coupled to the power line, and the third source of the third thin film transistor is coupled to the pixel electrode, which is an equivalent transformation of the above embodiments of the present disclosure.

The above embodiments are merely some specific embodiments of the present disclosure, but the protection scope of the present disclosure is not limited thereto. Any person skilled in the art could readily conceive of changes or replacement within the technical scope of the present disclosure, which shall all be included in the protection scope of the present disclosure. Therefore, the protection scope of the present disclosure shall be determined by the protection scope of the claims.

What is claimed is:

1. An array substrate, comprising a base substrate and a plurality of pixel units disposed on the base substrate, wherein at least one pixel unit includes:
   a plurality of thin film transistors including at least one first thin film transistor and a second thin film transistor, wherein the at least one first thin film transistor includes:
      a first active pattern disposed above the base substrate;
      a first gate disposed at a side of the first active pattern away from the base substrate; and
      a first source and a first drain that are disposed at a side of the first gate away from the base substrate, wherein the first source and the first drain are coupled to the first active pattern;
   and the second thin film transistor includes:
      a second active pattern disposed in a same layer as the first active pattern;
      a second source and a second drain that are disposed in a same layer as the first source and the first drain, wherein the second source and the second drain are coupled to the second active pattern, and
      a second gate disposed in a same layer as the first gate;
   a first electrode disposed in a same layer as the first active pattern, wherein the first electrode is coupled to the first drain;
   a second electrode disposed in a same layer as the first gate, wherein the second electrode is coupled to the second drain, and
   a third electrode disposed between the first electrode and the base substrate, wherein the third electrode is coupled to the second drain;
   orthographic projections of any two in a group consisting of the third electrode, the first electrode, the second electrode, and the first drain on the base substrate have an overlapping region, and the third electrode is coupled to the second electrode.

2. The array substrate according to claim 1, wherein the at least one pixel unit further includes light-shielding patterns disposed in a same layer as the third electrode, and orthographic projections of the first active pattern and the second active pattern on the base substrate are located within an orthographic projection of the light-shielding patterns on the base substrate.

3. The array substrate according to claim 2, wherein
a material of the first active pattern is an oxide semiconductor, and a material of the first electrode is an oxide conductor; and/or,
the first gate is made of a same material as the second electrode; and/or,
the light-shielding patterns are made of a same material as the third electrode, and a material of the light-shielding patterns is metal.

4. The array substrate according to claim 2, wherein the third electrode and the light-shielding patterns are disposed on the base substrate, and the array substrate further comprises:
a buffer layer disposed between a layer where the third electrode and the light-shielding patterns are located, and a layer where the first active pattern, the second active pattern and the first electrode are located;
a gate insulating layer disposed between the layer where the first active pattern, the second active pattern and the first electrode are located, and a layer where the first gate, the second gate and the second electrode are located; and
an interlayer insulating layer disposed between the layer where the first gate, the second gate and the second electrode are located, and a layer where the first source, the first drain, the second source and the second drain are located,
wherein the at least one pixel unit further includes:
a first via hole extending through the interlayer insulating layer, wherein the second drain is coupled to the second electrode though the first via hole;
a second via hole extending through the interlayer insulating layer, the gate insulating layer, and the buffer layer, wherein the second drain is coupled to the third electrode through the second via hole; and
a third via hole extending through the interlayer insulating layer and the gate insulating layer, wherein the first drain is coupled to the first electrode through the third via hole.

5. The array substrate according to claim 4, wherein the second via hole includes:
a first sub via hole extending through the interlayer insulating layer; and
a second sub via hole extending through the gate insulating layer and the buffer layer,
wherein the at least one pixel unit further includes a first interconnecting pattern disposed in a same layer as the second electrode, the second drain is coupled to the first interconnecting pattern through the first sub via hole, and the first interconnecting pattern is coupled to the third electrode though the second sub via hole.

6. The array substrate according to claim 4, further compring sense lines disposed in a same layer as the second electrode, wherein the at least one pixel unit further includes:
a sixth via hole including a third sub via hole and a fourth sub via hole, wherein the third sub via hole extends through the interlayer insulating layer, and the fourth sub via hole extends through the gate insulating layer and the buffer layer;
a seventh via hole including a fifth sub via hole and a sixth sub via hole, wherein the fifth sub via hole extends through the interlayer insulating layer, and the sixth sub via hole extends through the gate insulating layer and the buffer layer;
a second interconnecting pattern disposed in a same layer as the second electrode, wherein the second interconnecting pattern is coupled to the first source through the third sub via hole, and the second interconnecting pattern is coupled to one of the light-shielding patterns through the fourth sub via hole, wherein orthographic projections of the second interconnecting pattern and the one of the light-shielding patterns on the base substrate have an overlapping region; and
a third interconnecting pattern disposed in a same layer as the second electrode, wherein the third interconnecting pattern is coupled to one of the sense lines through the fifth sub via hole, and the third interconnecting pattern is coupled to the one of the light-shielding patterns through the sixth sub via hole.

7. The array substrate according to claim 4, wherein the plurality of thin film transistors further includes a third thin film transistor, and the third thin film transistor includes:
a third active pattern disposed in a same layer as the first active pattern;
a third source and a third drain that are disposed in a same layer as the first source and the first drain, wherein the third source and the third drain are coupled to the third active pattern; and
a third gate disposed in a same layer as the first gate, wherein the third gate is coupled to the second electrode.

8. The array substrate according to claim 7, wherein the at least one pixel unit further includes a pixel electrode disposed at a side of the third source and the third drain away from the base substrate, and the first drain and the third drain are coupled to the pixel electrode.

9. The array substrate according to claim 8, further comprising a planarization layer disposed between a layer where the pixel electrode is located and a layer where the third source and the third drain are located, wherein the at least one pixel unit further includes:
a fourth via hole extending through the planarization layer, wherein the third drain is coupled to the pixel electrode through the fourth via hole; and
a fifth via hole extending through the planarization layer, wherein the first drain is coupled to the pixel electrode through the fifth via hole.

10. The array substrate according to claim 8, wherein the at least one pixel unit further includes:
a light-emitting functional layer disposed above a surface of the pixel electrode away from the base substrate, and
a fourth electrode disposed above a surface of the light-emitting functional layer away from the base substrate.

11. A display device, comprising the array substrate according to claim 1.

12. A method of manufacturing the array substrate according to claim 1, the method comprising:
forming first electrodes and active patterns in a same layer above the base substrate;
forming second electrodes and gates in a same layer above the first electrodes and the active patterns, the gates being in one-to-one correspondence with the active patterns; and forming sources and drains above the second electrodes and the gates, each source and a corresponding drain being coupled to a corresponding active pattern, wherein before forming the first electrodes and the active patterns in the same layer above the base substrate, the method further comprises:

forming third electrodes on the base substrate, wherein orthographic projections of any two in a group consisting of the first electrode, the corresponding second electrode, a corresponding third electrode, and each drain of the at least one drain on the base substrate have an overlapping region, the first electrode is coupled to the at least one drain, and the corresponding third electrode is coupled to the corresponding second electrode;

forming the first electrodes and the active patterns in the same layer above the base substrate, includes: forming the first electrodes and first active patterns in a same layer;

forming the second electrodes and the gates in the same layer above the first electrode and the active patterns, includes: forming the second electrodes and first gates in a same layer;

forming the sources and the drains above the second electrodes and the gates, includes: forming first sources and first drains each first source and a corresponding first drain being coupled to a corresponding first active pattern, the corresponding first drain being coupled to a corresponding first electrode, wherein orthographic projections of any two in a group consisting of the corresponding first electrode, a corresponding second electrode, and the corresponding first drain on the base substrate have an overlapping region;

forming the first electrodes and the active patterns in the same layer above the base substrate, further includes:

forming second active patterns in a same layer as the first electrodes and the first active patterns;

forming the second electrodes and the gates in the same layer above the first electrode and the active patterns, further includes: forming second gates in a same layer as the second electrodes and the first gates; and forming the sources and the drains above the second electrode and the gates, further includes: forming second sources and second drains in a same layer as the first sources and the first drains, each second source and a corresponding second drain being coupled to a corresponding second active pattern; and the corresponding second drain being coupled to a corresponding second electrode, and being coupled to a corresponding third electrode.

13. The method according to claim 12, wherein forming the third electrodes on the base substrate, further includes: forming light-shielding patterns disposed in a same layer as the third electrodes, wherein the third electrodes and the light-shielding patterns are formed through a single patterning process, and orthographic projections of the first active patterns and the second active patterns that are to be formed above the base substrate are located within an orthographic projection of the light shielding patterns on the base substrate.

14. The method according to claim 13, wherein the first electrodes are made of oxide conductors formed by performing a conductor treatment on predetermined electrode patterns respectively; and a material of the predetermined electrode patterns is an oxide semiconductor, and the predetermined electrode patterns are formed by using a same patterning process as at least the first active patterns.

15. The method according to claim 14, wherein the second electrodes are formed by using a same patterning process as at least the first gates.

* * * * *